(12) United States Patent
Liu et al.

(10) Patent No.: US 11,329,671 B2
(45) Date of Patent: May 10, 2022

(54) EFFICIENT TRIANGULAR INTERLEAVER/DEINTERLEAVER FOR POLAR CODES

(71) Applicant: Telefonaktiebolaget LM Ericsson (publ), Stockholm (SE)

(72) Inventors: Qingchao Liu, Ottawa (CA); Xixian Chen, Ottawa (CA); Yashar Nezami, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 94 days.

(21) Appl. No.: 16/967,008

(22) PCT Filed: Apr. 27, 2018

(86) PCT No.: PCT/IB2018/052951
§ 371 (c)(1),
(2) Date: Aug. 3, 2020

(87) PCT Pub. No.: WO2019/207348
PCT Pub. Date: Oct. 31, 2019

(65) Prior Publication Data
US 2021/0044307 A1    Feb. 11, 2021

(51) Int. Cl.
| | | |
|---|---|---|
| *H03M 13/00* | (2006.01) | |
| *H03M 13/27* | (2006.01) | |
| *H03M 13/13* | (2006.01) | |
| *H04B 1/04* | (2006.01) | |
| *H04B 1/06* | (2006.01) | |

(52) U.S. Cl.
CPC ....... *H03M 13/2792* (2013.01); *H03M 13/13* (2013.01); *H03M 13/616* (2013.01); *H04B 1/04* (2013.01); *H04B 1/06* (2013.01)

(58) Field of Classification Search
CPC ............. H03M 13/2792; H03M 13/13; H03M 13/616; H04B 1/04; H04B 1/06
See application file for complete search history.

(56) References Cited

PUBLICATIONS

Bioglio et al. Design of POLAR Codes in 5G New Radio. Jan. 2020, pp. 1-12. arXiv: 1804.04389v3 IEEE.*
(Continued)

*Primary Examiner* — Samir W Rizk
(74) *Attorney, Agent, or Firm* — Sage Patent Group

(57) ABSTRACT

A method for use in a wireless transmitter of interleaving coded bits includes: determining an integer number (M) of polar coded bits {e(0), . . . , e(M−1)} for wireless transmission; determining a smallest integer number (T) such that T(T+1)/2>=M; and determining a one-dimensional interleaving index array, interleavingId( ), that represents the column by column non-zero elements of a two-dimensional matrix. The two-dimensional matrix includes a hypothetical T by T matrix containing the polar coded bits {e(0), . . . , e(M−1)} input row by row without using the lower right corner elements of the T×T matrix. The method further includes: interleaving the polar coded bits {e(0), . . . , e(M−1)} using the one-dimensional interleaving index array resulting in the output sequence {f(0), . . . , f(M−1)} wherein f(i)=e(interleavingId(i)); and transmitting the interleaved polar coded bits to a wireless receiver.

20 Claims, 7 Drawing Sheets

400

412 – determine an integer number (M) of polar coded bits {e(0), . . ., e(M-1)} for wireless transmission 414 – determine a smallest integer number (T) such that T(T+1)/2 >=M 416 – determine a one-dimensional interleaving index array, interleavingId()

418 – interleave the polar coded bits using the one-dimensional interleaving index array 420 – transmit the interleaved polar coded bits to a wireless receiver

(56) References Cited

PUBLICATIONS

PCT International Search Report and Written Opinion dated Jan. 2, 2019 for International Application PCT/IB2018/052951, 10 pages.
Qualcomm Inc., 3GPP TSG-RAN RAN1#90, R1-1713474, "Design and Evaluation of Interleaver for Polar Codes", Prague, CZ, Aug. 21-25, 2017, 12 pages.
Ericsson, 3GPP TSG RAN WG1 NR Ad-hoc#2, R1-1710495, "Polar Code Performance in Fading Channel", Qingdao, P.R. China, Jun. 27-30, 2017, 8 pages.
Bioglio, V. et al., "Design of Polar Codes in 5G New Radio", Cornell University, Ithaca, NY, Apr. 12, 2018, 10 pages.
Qualcomm Inc., 3GPP TSG-RAN WG1 Meeting#89, R1-1708649, "Interleaver Design for Polar codes", Hangzhou, P.R. China, May 15-19, 2017, 6 pages.
3GPP, Technical Specification Group Radio Access Network, "Physical Layer Procedures for Control" (Release 15), 3GPP TS 38.213 V15.0.0, Jan. 3, 2018, 56 pages.

* cited by examiner

EFFICIENT TRIANGULAR INTERLEAVER/DEINTERLEAVER FOR POLAR CODES

CROSS-REFERENCE TO RELATED APPLICATIONS

This application is a 35 U.S.C. § 371 national stage application for International Application No. PCT/IB2018/052951, entitled "EFFICIENT TRIANGULAR INTERLEAVER/DEINTERLEAVER FOR POLAR CODES", filed on Apr. 27, 2018, the disclosures and contents of which are hereby incorporated by reference in their entireties.

TECHNICAL FIELD

Particular embodiments are directed to wireless communications and, more particularly, to an efficient coded bit interleaver/deinterleaver for polar codes in fifth generation (5G) new radio (NR).

BACKGROUND

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, achieve the symmetric capacity of the binary-input discrete memoryless channels using a low-complexity successive cancellation (SC) decoder. The finite-length performance of polar codes can be improved by using a list decoder that enables polar codes to approach the performance of the optimal maximum likelihood (ML) decoder (Shannon limits). Furthermore, a polar code concatenated with a simple cyclic redundancy check (CRC) outperforms well-optimized low-density parity check (LDPC) and Turbo codes, even for short block lengths.

Because of the good performance and low complexity of polar codes, the Third Generation Partnership Project (3GPP) has specified polar codes for use with control channels in fifth generation (5G) new radio (NR) standards. The downlink control information (DCI)/physical downlink control channel (PDCCH) and physical broadcast channel (PBCH) are specified with a maximum of 512 bits block and 24 bits CRC. The uplink control information (UCI)/physical uplink control channel (PUCCH) and physical uplink shared channel (PUSCH) are specified with a maximum of 1024 block size with information bits greater than or equal to 12, and with 7 and 11 CRC bits and parity check bits.

Polar coding transforms a pair of identical binary-input channels into two distinct channels of different qualities, one better and one worse than the original binary-input channel. By repeating such a pair-wise polarizing operation on a set of $N=2^n$ independent uses of a binary-input channel, a set of $2^n$ "bit-channels" of varying qualities can be obtained. Some of these bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver.

The input bits to the nearly useless and the nearly perfect channel are commonly referred to as frozen bits and non frozen (or information) bits, respectively. Only the non-frozen bits are used to carry data in a polar code.

The good and bad channels are polarized based on code construction. Because the code is sensitive to channel types, a code is selected based on all channel types and a compromise. Examples of polar encoding and decoding are illustrated in FIGS. 1 and 2, respectively.

FIG. 1 is a block diagram illustrating a polar encoder processing chain. In the transmit direction, downlink (DL) polar code selection block 10 selects an appropriate polar code based on the type and number of information bits. The time to complete the polar code selection function may be referred to as the code construct latency.

CRC generation block 12 attaches CRC bits. Polar interleaver block 14 performs polar interleaving. Polar parity check (PC) bits generation block 16 generates polar parity check bits.

Polar encode block 18 polar encodes the information bits, CRC bits, and parity check bits. The time to complete the polar encoding function may be referred to as encoder latency.

Polar sub-block interleaver block 20 performs sub-clock interleaving. Polar rate matcher block 22 performs rate matching. Coded bit interleaver block 24 performs bit interleaving. The time to complete the functions of block 12 through block 24 may be referred to as the transmit chain latency.

The output of the polar encoder processing chain is modulated using quadrature phase shift keying (QPSK) and transmitted through the air using radio. The receiver processing chain is the reverse of the transmitter. An example is illustrated in FIG. 2.

FIG. 2 is a block diagram illustrating a polar decoder processing chain. In the receive direction, uplink (UL) polar code selection block 26 selects a polar code. The time to complete the polar code selection function may be referred to as the code construct latency.

Coded bit deinterleaver block 28 deinterleaves the coded bits. Polar rate dematcher block 30 performs rate dematching. Polar sub-block deinterleaver 32 performs deinterleaving.

Polar decoder block 34 performs polar decoding. The time to complete the polar decoding function may be referred to as decoder latency.

Polar PC verification block 36 performs a parity check. Polar deinterleaver block 38 performs polar deinterleaving. CRC check block 40 performs CRC checking. The time to complete the functions of block 28 through block 40 may be referred to as the receive chain latency.

The existing solution for interleaving and deinterleaving of coded bits is described in 3GPP 38212-f00, Section 5.4.1.3 Interleaving of Coded Bits. Suppose the bit sequence $e_0, e_1, e_2, \ldots, e_{M-1}$ is interleaved into bit sequence $f_0, f_1, f_2, \ldots, f_{M-1}$. The exiting solution first calculates T as the smallest integer such that $T(T+1)/2 >= M$. It then writes the input bit sequence into a T×T matrix row by row with lower right corner elements empty. The output bit sequence is obtained by reading the bits from the matrix column by column, excluding the empty elements.

For example, if the length of the input sequence, M, is 13, and T is calculated as 5, then writing the input bit sequence into a 5×5 matrix row by row starting from the first row becomes:

| e0  | e1  | e2  | e3 | e4 |
|-----|-----|-----|----|----|
| e5  | e6  | e7  | e8 |    |
| e9  | e10 | e11 |    |    |
| e12 |     |     |    |    |

The output sequence is obtained by reading the bits from the matrix column by column starting from the first column, excluding the empty elements, which can be expressed as e0, e5, e9, e12, e1, e6, e10, e2, e7, e11, e3, e8, e4.

As another example, if M=12, and the calculated T is 5 again, then writing the input bit sequence into a 5×5 matrix row by row starting from the first row becomes:

| e0 | e1  | e2  | e3 | e4 |
|----|-----|-----|----|----|
| e5 | e6  | e7  | e8 |    |
| e9 | e10 | e11 |    |    |

The output sequence is e0, e5, e9, e1, e6, e10, e2, e7, e11, e3, e8, e4.

As a third example if M=15 and T=5, then the input matrix is:

| e0  | e1  | e2  | e3 | e4 |
|-----|-----|-----|----|----|
| e5  | e6  | e7  | e8 |    |
| e9  | e10 | e11 |    |    |
| e12 | e13 |     |    |    |
| e14 |     |     |    |    |

The output sequence is e0, e5, e9, e12, e14, e1, e6, e10, e13, e2, e7, e11, e3, e8, e4.

For deinterleaving, the process is reversed. The input sequence, $f_0, f_1, \ldots, f_M$, is written into a T×T matrix column by column starting from the first column. The output sequence is obtained by reading the bits from the matrix row by row starting from the first row, excluding the empty elements.

A problem with the current method is high computation complexity. Another problem is large memory consumption.

SUMMARY

In particular embodiments, a one-dimensional interleaving index array is calculated during the preparation phase instead of forming a two-dimensional array. The interleaving index array calculation is based on a row counter array, an accumulated row counter array, and a column counter array.

According to some embodiments, a method for use in a wireless transmitter of interleaving coded bits comprises: determining an integer number (M) of polar coded bits $\{e(0), \ldots, e(M-1)\}$ for wireless transmission; determining a smallest integer number (T) such that $T(T+1)/2>=M$; and determining a one-dimensional interleaving index array, interleavingId( ) that represents the column by column non-zero elements of a two-dimensional matrix. The two-dimensional matrix comprises a hypothetical T by T matrix containing the polar coded bits $\{e(0), \ldots, e(M-1)\}$ input row by row without using the lower right corner elements of the T×T matrix. The method further comprises: interleaving the polar coded bits $\{e(0), \ldots, e(M-1)\}$ using the one-dimensional interleaving index array resulting in the output sequence $\{f(0), \ldots, f(M-1)\}$ wherein f(i)=e(interleavingId (i)); and transmitting the interleaved polar coded bits to a wireless receiver.

In particular embodiments, determining M comprises receiving a scheduling request that includes an indication of an amount of data to be transmitted. The one-dimensional interleaving index array may be determined prior to polar encoding. A particular advantage is that particular operations are performed outside of the critical period, which reduces latency.

In particular embodiments, determining the one-dimensional interleaving index array comprises determining a row counter array, an accumulated row counter array, and a column counter array. Each element in the row counter array represents the total number of non-zero elements in a corresponding row of the two-dimensional matrix. Each element j in the accumulated row counter array represents the sum of each element in the row counter array from the first element up to the jth element. Each element in the column counter array represents the total number of non-zero elements in a corresponding column of the two-dimensional matrix. The column counter array may be determined based on the row counter array and the accumulated row counter array. A particular advantage is that using the one-dimensional array is computationally less complex than calculating the two-dimensional matrix.

According to some embodiments, a wireless transmitter comprises processing circuitry operable to: determine an integer number (M) of polar coded bits $\{e(0), \ldots, e(M-1)\}$ for wireless transmission; determine a smallest integer number (T) such that $T(T+1)/2>=M$; and determine a one-dimensional interleaving index array, interleavingId( ) that represents the column by column non-zero elements of a two-dimensional matrix. The two-dimensional matrix comprises a hypothetical T by T matrix containing the polar coded bits $\{e(0), \ldots, e(M-1)\}$ input row by row without using the lower right corner elements of the T×T matrix. The processing circuitry is further operable to: interleave the polar coded bits $\{e(0), \ldots, e(M-1)\}$ using the one-dimensional interleaving index array resulting in the output sequence $\{f(0), \ldots, f(M-1)\}$ wherein f(i)=e(interleavingId (i)); and transmit the interleaved polar coded bits to a wireless receiver.

In particular embodiments, the processing circuitry is operable to determine M by receiving a scheduling request that includes an indication of an amount of data to be transmitted. The processing circuitry may be operable to determine the one-dimensional interleaving index array prior to polar encoding. A particular advantage is that particular operations are performed outside of the critical period, which reduces latency.

In particular embodiments, the processing circuitry is operable to determine the one-dimensional interleaving index array by determining a row counter array, an accumulated row counter array, and a column counter array. Each element in the row counter array represents the total number of non-zero elements in a corresponding row of the two-dimensional matrix. Each element j in the accumulated row counter array represents the sum of each element in the row counter array from the first element up to the jth element. Each element in the column counter array represents the total number of non-zero elements in a corresponding column of the two-dimensional matrix. The processing circuitry may be operable to determine the column counter array based on the row counter array and the accumulated row counter array. A particular advantage is that using the one-dimensional array is computationally less complex than calculating the two-dimensional matrix.

In particular embodiments, the wireless transmitter comprises a network node or a wireless device.

According to some embodiments, a method for use in a wireless receiver of deinterleaving coded bits comprises: determining an integer number (M) of polar coded bits $\{e(0), \ldots, e(M-1)\}$ to be received via wireless transmission; determining a smallest integer number (T) such that $T(T+1)/2>=M$; and determining a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The method further comprises: receiving a sequence of interleaved polar coded soft bits {f(0), . . . , f(M−1)} from a wireless transmitter; and deinterleaving the sequence of interleaved polar coded soft bits {f(0), . . . , f(M−1)} using the one-dimensional interleaving index array resulting in the output sequence {e(0), . . . , e(M−1)} wherein e(interleavingId(i))=f(i).

In particular embodiments, determining M comprises receiving a scheduling request that includes an indication of an amount of data to be received. The one-dimensional interleaving index array may be determined prior to receiving the sequence of interleaved polar coded soft bits. A particular advantage is that particular operations are performed outside of the critical period, which reduces latency.

In particular embodiments, determining the one-dimensional interleaving index array comprises determining a row counter array, an accumulated row counter array, and a column counter array. Each element in the row counter array represents the total number of non-zero elements in a corresponding row of the two-dimensional matrix. Each element j in the accumulated row counter array represents the sum of each element in the row counter array from the first element up to the jth element. Each element in the column counter array represents the total number of non-zero elements in a corresponding column of the two-dimensional matrix. The column counter array may be determined based on the row counter array and the accumulated row counter array. A particular advantage is that using the one-dimensional array is computationally less complex than calculating the two-dimensional matrix.

According to some embodiments, a wireless receiver comprises processing circuitry operable to: determine an integer number (M) of polar coded bits {e(0), . . . , e(M−1)} to be received via wireless transmission; determine a smallest integer number (T) such that T(T+1)/2>=M; and determine a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The processing circuitry is further operable to: receive a sequence of interleaved polar coded soft bits {f(0), . . . , f(M−1)} from a wireless transmitter; and deinterleave the interleaved polar coded soft bits {f(0), . . . , f(M−1)} using the one-dimensional interleaving index array resulting in the output sequence {e(0), . . . , e(M−1)} wherein e(interleavingId(i))=f(i).

In particular embodiments, the processing circuitry is operable to determine M by receiving a scheduling request that includes an indication of an amount of data to be received. The processing circuitry may be operable to determine the one-dimensional interleaving index array prior to receiving the sequence of interleaved polar coded bits. A particular advantage is that particular operations are performed outside of the critical period, which reduces latency.

In particular embodiments, the processing circuitry is operable to determine the one-dimensional interleaving index array by determining a row counter array, an accumulated row counter array, and a column counter array. Each element in the row counter array represents the total number of non-zero elements in a corresponding row of the two-dimensional matrix. Each element j in the accumulated row counter array represents the sum of each element in the row counter array from the first element up to the jth element.

Each element in the column counter array represents the total number of non-zero elements in a corresponding column of the two-dimensional matrix. The processing circuitry may be operable to determine the column counter array based on the row counter array and the accumulated row counter array. A particular advantage is that using the one-dimensional array is computationally less complex than calculating the two-dimensional matrix.

In particular embodiments, the wireless receiver comprises a network node or a wireless receiver comprises a wireless device.

According to some embodiments, a wireless transmitter comprises a determining module, a transmitting module, and an interleaving/deinterleaving module. The determining module is operable to: determine an integer number (M) of polar coded bits {e(0), . . . , e(M−1)} for wireless transmission; determine a smallest integer number (T) such that T(T+1)/2>=M; and determine a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The interleaving/deinterleaving module is operable to interleave the polar coded bits {e(0), . . . , e(M−1)} using the one-dimensional interleaving index array resulting in the output sequence {f(0), . . . , f(M−1)} wherein f(i)=e(interleavingId(i)). The transmitting module is operable to transmit the interleaved polar coded bits to a wireless receiver.

According to some embodiments, a wireless receiver comprises a receiving module, a determining module, and an interleaving/deinterleaving module. The determining module is operable to: determine an integer number (M) of polar coded bits {e(0), . . . , e(M−1)} to be received via wireless transmission; determine a smallest integer number (T) such that T(T+1)/2>=M; and determine a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The receiving module is operable to receive a sequence of interleaved polar coded soft bits {f(0), . . . , f(M−1)} from a wireless transmitter. The interleaving/deinterleaving module is operable to deinterleave the interleaved polar coded soft bits {f(0), . . . , f(M−1)} using the one-dimensional interleaving index array resulting in the output sequence {e(0), . . . , e(M−1)} wherein e(interleavingId(i))=f(i).

Also disclosed is a computer program product. The computer program product comprises instructions stored on non-transient computer-readable media which, when executed by a processor, perform the steps of: determining an integer number (M) of polar coded bits {e(0), . . . , e(M−1)} for wireless transmission; determining a smallest integer number (T) such that T(T+1)/2>=M; and determining a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The instructions further perform the steps of: interleaving the polar coded bits {e(0), . . . , e(M−1)} using the one-dimensional interleaving index array resulting in the output sequence {f(0), . . . , f(M−1)} wherein f(i)=e(interleavingId(i)); and transmitting the interleaved polar coded bits to a wireless receiver.

Another computer program product comprises instructions stored on non-transient computer-readable media which, when executed by a processor, perform the steps of: determining an integer number (M) of polar coded bits {e(0), . . . , e(M−1)} to be received via wireless transmission; determining a smallest integer number (T) such that T(T+1)/2>=M; and determining a one-dimensional interleaving index array, interleavingId( ), that represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix. The instructions further perform the steps of: receiving a sequence of interleaved polar coded soft bits {f(0), . . . , f(M−1)} from a wireless transmitter; and deinterleaving the sequence of interleaved polar coded soft bits {f(0), . . . , f(M−1)} using the one-dimensional interleaving index array resulting in the output sequence {e(0), . . . , e(M−1)} wherein e(interleavingId(i))=f(i).

Certain embodiments of the present disclosure may provide one or more technical advantages. For example, particular embodiments, because of the reduced complexity, use fewer processor cycles. Particular embodiments may be 57 times faster than the existing solution for deinterleaving operation at a receiver and 35 times faster for the interleaving operation at a transmitter. The processor cycle reduction is particularly useful for fifth generation (5G) new radio (NR) because the slot time duration is much shorter than long term evolution (LTE). For LTE, the slot duration is 1 ms. For 5G, however, the slot duration can be as short as 125 us.

Particular embodiments reduce memory usage. For existing solutions, total memory requirements may be 62×62=3844 words. Particular embodiments may only require 62×3+1024=1210 words, which is less than a third of the existing solutions. Other advantages may be readily available to one having skill in the art. Certain embodiments may have none, some, or all of the recited advantages.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
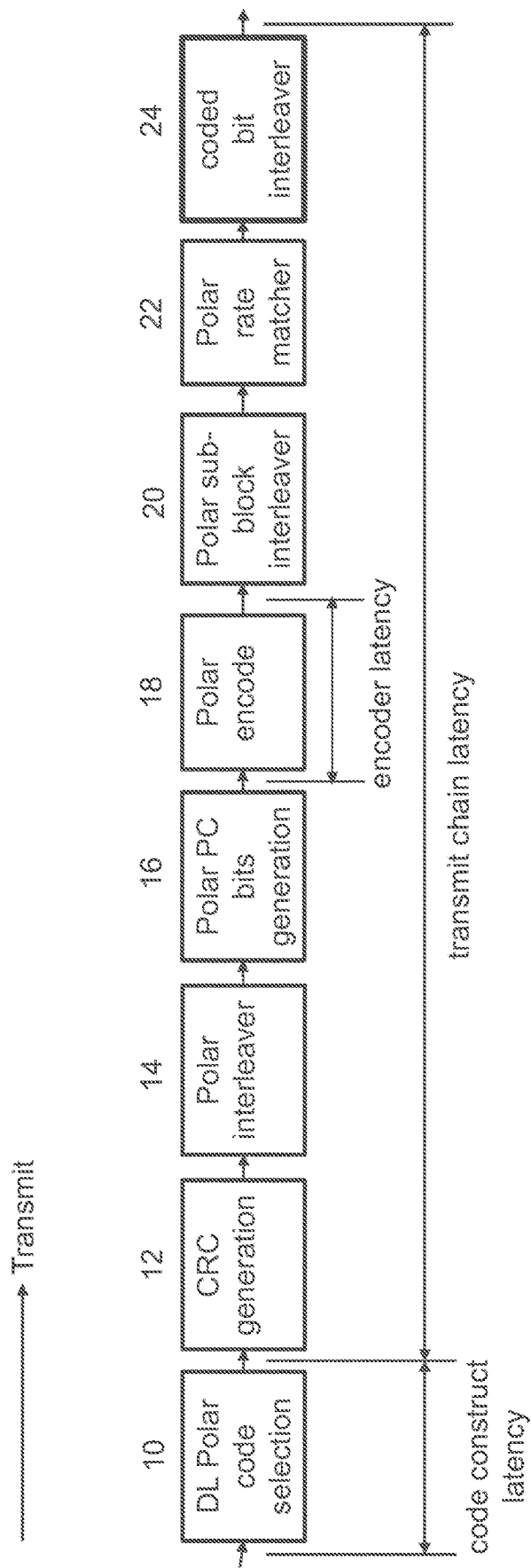
FIG. 1 is a block diagram illustrating a polar encoder processing chain.

Third Generation Partnership Project (3GPP) has specified polar codes for use with control channels in fifth generation (5G) new radio (NR) standards. The existing solution for interleaving and deinterleaving of coded bits is described in 3GPP 38212-f00, Section 5.4.1.3. An input bit sequence of length M is interleaved into an interleaved bit sequence by first calculating T (i.e., the smallest integer such that T(T+1)/2>=M). The input bit sequence is written into a T×T matrix row by row with lower right corner elements empty. The output bit sequence is obtained by reading the bits from the matrix column by column, excluding the empty elements.

For deinterleaving, the process is reversed. The input sequence is written into a T×T matrix column by column starting from the first column. The output sequence is obtained by reading the bits from the matrix row by row starting from the first row, excluding the empty elements.

A problem with the current method is high computation complexity. Another problem is large memory consumption.

Particular embodiments obviate the problems of using a two-dimensional array described above and include speeding up the interleaving and deinterleaving processes using a one-dimensional interleaving index array formed during the preparation stage.

For example, the one-dimensional interleaving index array may be computed after receiving scheduling information because, based on the scheduling information, the wireless transmitter knows how many information bits will be transmitted (i.e., M) and can calculate T, even though the information bits are not yet ready for transmission. Similarly, a wireless receiver may compute the one-dimensional interleaving index array after receiving scheduling information, but before receiving the transmission. This results in decreased transmit and/or receive latency.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 3-7B of the drawings, like numerals being used for like and corresponding parts of the various drawings. LTE and NR are used throughout this disclosure as an example cellular system, but the ideas presented herein may apply to other wireless communication systems as well.

Figure 3:
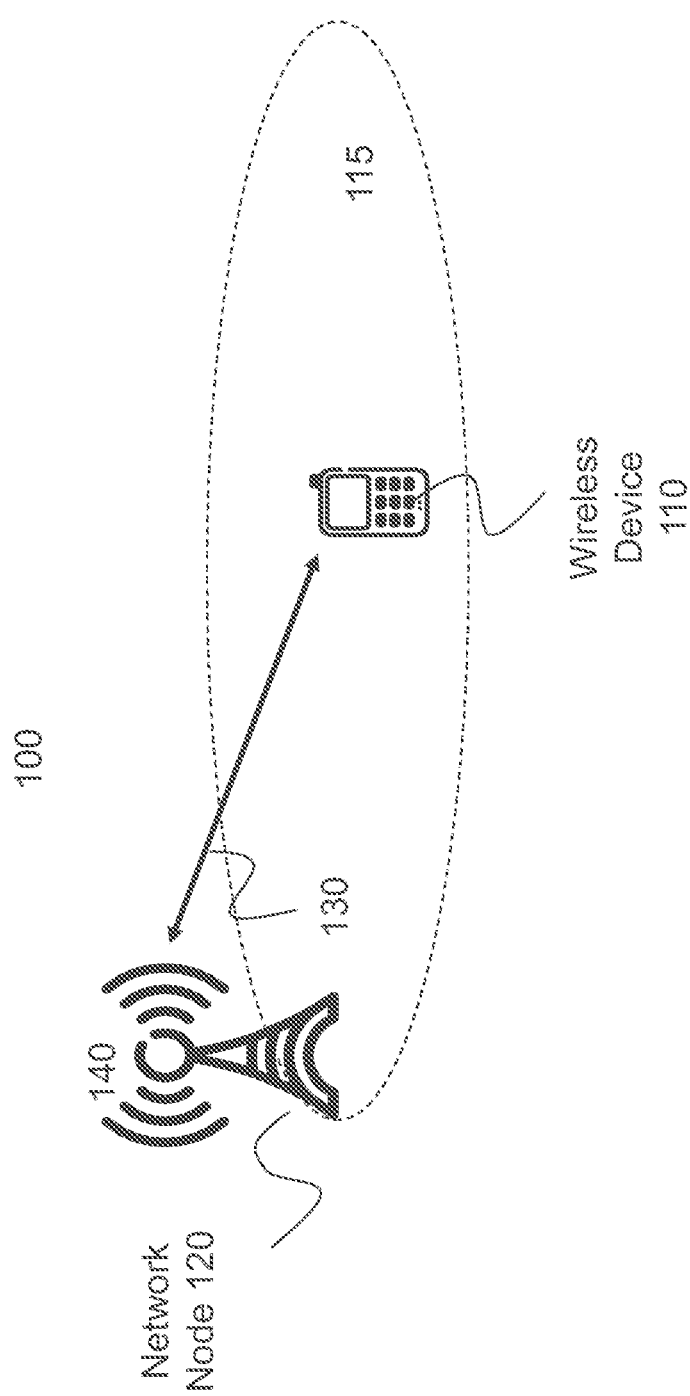
FIG. 3 is a block diagram illustrating an example wireless network, according to some embodiments.

FIG. 3 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter 140 or multiple transmitters 140 for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless device 110, network node 120, or any other component of network 100 that transmits wireless signals 130 may be referred to as a wireless transmitter. Wireless device 110, network node 120, or any other component of network 100 that receives wireless signals 130 may be referred to as a wireless receiver.

In particular embodiments, wireless signals 130 may be encoded/decoded using a polar code. For example, wireless device 110 and/or network node 120 may use a polar code for encoding wireless signal 130. In some embodiments, the encoding/decoding may include an interleaver/deinterleaver.

Figure 2:
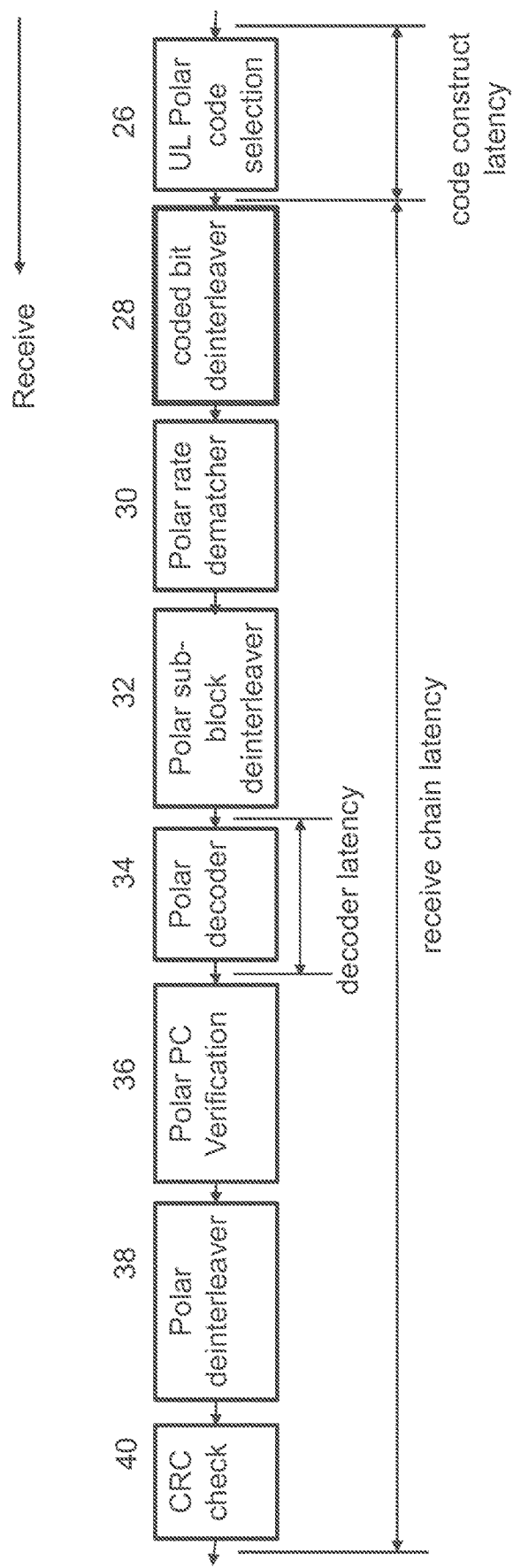
FIG. 2 is a block diagram illustrating a polar decoder processing chain.

For example, wireless device 110 and network node 120 may include transmit chain components such as those illustrated in FIG. 1 and the receive chain components such as those illustrated in FIG. 2. Interleaving is described in more detail below and with respect to FIGS. 4-5.

In wireless network 100, each network node 120 may use any suitable radio access technology, such as long term evolution (LTE), LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 6A below. Similarly, a network node may include any suitable combination of hardware and/or software. For example, in particular embodiments, a network node, such as network node 120, may include the components described with respect to FIG. 7A below.

Particular embodiments include speeding up the interleaving and deinterleaving processes using a one-dimensional interleaving index array formed during the preparation stage. The followings are three examples of the interleaving index array for M=13, 12, and 15 (i.e., the same examples described above in the Background), respectively: (1) (M=13): interleavingId={0, 5, 9, 12, 1, 6, 10, 2, 7, 11, 3, 8, 4}; (2) (M=12): interleavingId={0, 5, 9, 1, 6, 10, 2, 7, 11, 3, 8, 4}; and (3) (M=15): interleavingId={0, 5, 9, 12, 14, 1, 6, 10, 13, 2, 7, 11, 3, 8, 4}.

By using the interleaving index array, the interleaving and deinterleaving processes is performed efficiently during the time critical period (e.g., the transmit chain latency period illustrated in FIG. 1, or the receive chain latency period illustrated in FIG. 2).

The following pseudo code describes the interleaving process, where $\{e(0), e(1), \ldots, e(M-1)\}$ is the input sequence and $\{f(0), f(1), \ldots, f(M-1)\}$ is the output sequence:

```
For (i = 0; i < M; i++) {
    f(i) = e (interleavingId(i));
}
```

The following pseudo code describes the deinterleaving process, where $\{f(0), f(1), \ldots, f(M-1)\}$ is the input sequence and $\{e(0), e(1), \ldots, e(M-1)\}$ is the output sequence:

```
For (i = 0; i < M; i++) {
    e (interleavingId(i)) = f(i);
}
```

Formation of the interleaving array (i.e., interleavingId) is described in more detail below, according to some embodiments.

Particular embodiments calculate a row counter array and an accumulated row counter array. As described above, the existing solution forms a T×T two-dimensional matrix by the input sequence. For example, if M=13, the matrix is formed as:

| e0  | e1  | e2  | e3 | e4 |
|-----|-----|-----|----|----|
| e5  | e6  | e7  | e8 |    |
| e9  | e10 | e11 |    |    |
| e12 |     |     |    |    |

Particular embodiments, instead of forming the two-dimensional matrix, calculate the row counter array and accumulated row counter array during the preparation phase. Each element in the row counter array represents the total number of non-zero elements in its corresponding row in the two-dimensional matrix.

Herein, the term non-zero elements refers to the elements other than the empty elements in the lower right corner of the T×T matrix, whether the empty elements are actually set to 0 or any other suitable value. Also, the two-dimensional matrix may be referred to as a hypothetical T by T matrix because the two-dimensional matrix is not actually calculated in particular embodiments. The hypothetical two-dimensional matrix is used to describe the relationship of various arrays, such as the interleaving array, row counter array, accumulated row counter array, and column counter array, with respect to the existing solutions that calculate and use the two-dimensional matrix.

As one example of determining a row counter array, if M=13, the elements in the first, second, third, fourth, and fifth, rows in the above matrix are 5, 4, 3, 1, and 0, respectively. The row counter array is {5, 4, 3, 1, 0}.

Particular embodiments form the accumulated row counter array based on the row counter array. The first element of the accumulated row counter array is the first element of row counter array, which in this example is 5. The second element is the sum of the first and second elements of row counter array, which is 9. The third is the sum of the first, second, and the third elements of row counter array, which is 12 . . . . In summary, if M=13, the accumulated row counter array would be {5, 9, 12, 13, 13}. In general, each element (i) of the accumulated row counter array equals the sum of elements 0, . . . , (i) of the row counter array (i.e., each element i in the accumulated row counter array represents the sum of each element in the row counter array from the first element up to the ith element).

Two more examples derive the row counter array and accumulated row counter array with M=12 and M=15. For M=12, the row counter array is {5, 4, 3, 0, 0}, and the accumulated row counter array is {5, 9, 12, 12, 12}. For M=15, the row counter array is {5, 4, 3, 2, 1}, and the accumulated row counter array is {5, 9, 12, 14, 15}. The following is a more detailed description of how particular embodiments calculate the row counter array and accumulated row counter array efficiently for different M values without forming the two-dimensional array.

Particular embodiments form a one-dimensional array as A={N, N-1, N-2, N-3, . . . , 1} with its elements in descending order. N is large enough to cover the maximum M value. Based on the input sequence length, T is calculated as the smallest integer such that T(T+1)/2>=M. Particular embodiments form another one-dimensional array with T elements, B={T, T-1, T-2, . . . , 1} by using A with proper addressing. For example, assuming 0 is the first index of A and B, then the first and last elements of B are located at (N-T) and (N-1) of A, respectively.

The following pseudo code describes calculating the row counter array and accumulated row counter array based on B:

```
sum = 0
for (i=0; i<T; i++) {
    if((sum+B(i)) <= M) {
        rowCounter(i) = B(i);
        sum += B(i);
    } else {
        b1 = M - (sum + B(i));
        b2 = (sum <= M) ? (M - sum) : 0;
        rowCounter (i) = (b1 > 0) ? b1 : b2;
        sum += rowCounter(i);
    }
    accRowCounter(i) = sum;
}
```

Particular embodiments include calculating a column counter array. After obtaining the row counter array and accumulated row counter array, particular embodiments may easily calculate the column counter array. Each element in the column counter array represents the total number of elements in its corresponding column in the two-dimensional matrix.

For example, for M=13 the column counter array is {4, 3, 3, 2, 1}. For M=12, the column counter array is {3, 3, 3, 2, 1}. For M=15, the column counter array is {5, 4, 3, 2, 1}.

The following pseudo code describes calculating the column counter array based on the row counter array:

```
for (i=0; i<T; i++) { columncounter(i) = 0;}
j_start = 0;
for (i=T-1; i>=0; i--) {
    for (j = j_start; j < (T-i); j++) {
        if((columncounter(i) == 0) && ((rowCounter (i) - j) > 0)) {
            colomnCounter(i) = i + 1;
            j_start = j;
        }
    }
}
```

Using the row counter array, the column counter array, and the accumulated row counter array, particular embodiments may efficiently calculate the interleaving index array. The following pseudo code describes calculating the interleaving index array:

```
k = 0
for (i=0; i<T; i++) {
    for (j=0; j < columncounter(i); j++) {
        interleavingId(k++) = accRowCounter(j) - rowCounter(j) + i;
    }
}
```

Particular embodiments may include methods in a wireless device and/or a network node. The examples and embodiments described above may be generally represented by the flowcharts in FIGS. 4 and 5.

Figure 4:
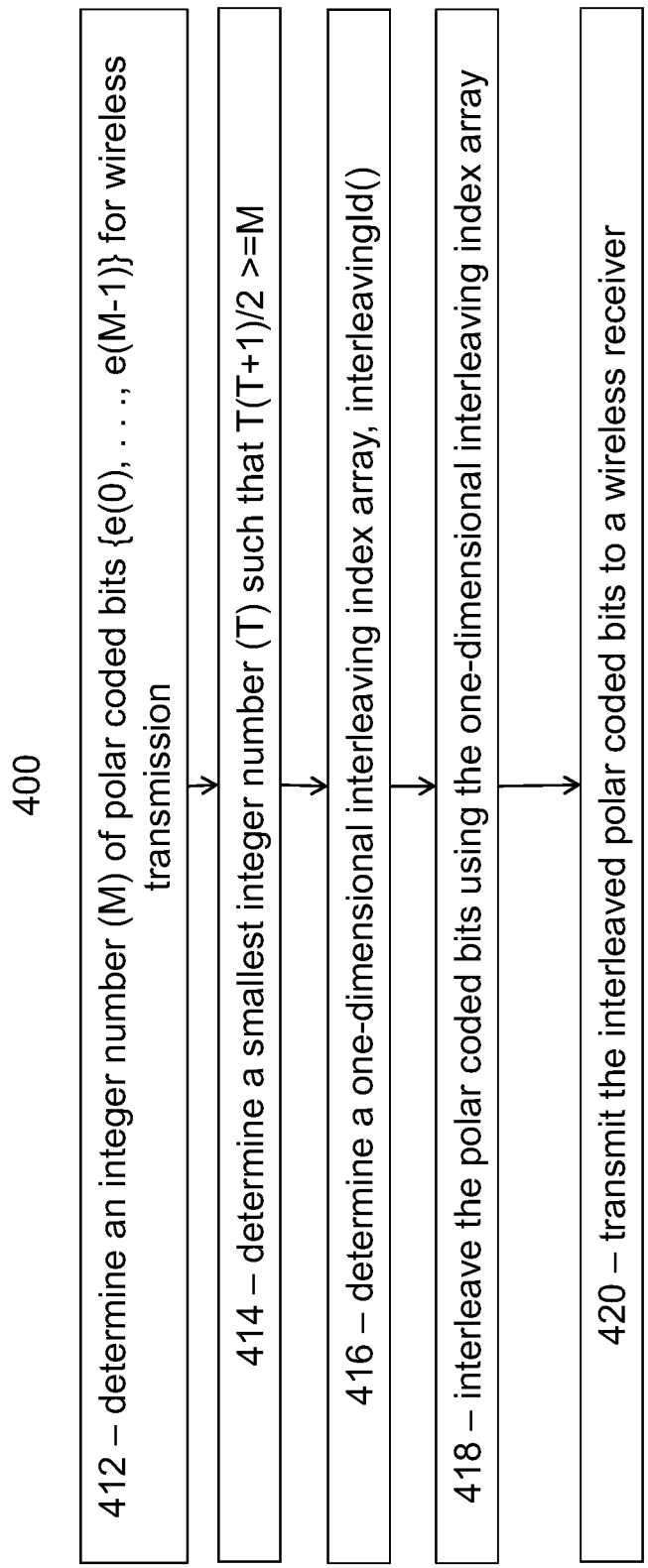
FIG. 4 is a flowchart of an example method in a wireless device, according to some embodiments.

FIG. 4 is a flow diagram illustrating an example method in a wireless transmitter of interleaving coded bits, according to some embodiments. In particular embodiments, one or more steps of FIG. 4 may be performed by wireless device 110 or network node 120 described with respect to FIG. 3.

The method begins at step 412, where the wireless transmitter determines an integer number (M) of polar coded bits {e(0), . . . , e(M-1)} for wireless transmission. For example, network node 120 may receive data for transmission to a wireless receiver, such as wireless device 110. Based on the amount of data to transmit, network node 120 may determine how many polar coded bits will be transmitted. In particular embodiments, network node 120 generates a scheduling request to schedule the data transmission to wireless device 110. As part of receiving the scheduling request and sending the scheduling request to wireless device 110, network node 120 may inspect the scheduling request to determine how much data is to be transmitted and thus determine the number of polar coded bits.

At step 414, the wireless transmitter determines a smallest integer number (T) such that T(T+1)/2>=M. For example, when M is determined to be 15, then T is 5. Other examples are described above.

At step 416, the wireless transmitter determines a one-dimensional interleaving index array, interleavingId( ). The one-dimensional interleaving index array represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix.

In particular embodiments, the wireless transmitter determines the one-dimensional interleaving index array using a row counter array, an accumulated row counter array, and a column counter array, as described above. For example, the row counter array represents the total number of non-zero elements in a corresponding row of the two-dimensional matrix. Each element j in the accumulated row counter array represents the sum of each element in the row counter array from the first element up to the jth element. The column counter array is determined based on the row counter array and the accumulated row counter array. Using the row counter array, the column counter array, and the accumulated row counter array, particular embodiments may efficiently calculate the interleaving index array. Example pseudocode for calculating the interleaving index array using a row counter array, an accumulated row counter array, and a column counter array is described above. Although particular pseudocode examples are given above, one of skill will recognize other variations may accomplish the same or similar results.

In particular embodiments, the wireless transmitter may determine the one-dimensional interleaving index array prior to polar encoding. For example, network node 120 may use the information in a scheduling request to determine how many polar coded bits will eventually be transmitted and determine the one-dimensional interleaving index array based on the number of polar coded bits before performing the polar encoding. A particular advantage is that the one-dimensional interleaving index array may be determined outside of the critical transmission chain, which reduces latency.

At step 418, the wireless transmitter interleaves the polar coded bits using the one-dimensional interleaving index array resulting in the output sequence {f(0), . . . , f(M−1)} wherein f(i)=e(interleavingId(i)). For example, network node 120, after performing the operations in blocks 10 through 22 of FIG. 1, may interleave the polar coded bits. The interleaving is efficient because, instead of calculating the two-dimensional T×T matrix, particular embodiments use the predetermined one-dimensional interleaving index array to interleave the bits.

At step 420, the wireless transmitter transmits the interleaved polar coded bits to a wireless receiver. For example, network node 120 may transmit interleaved polar coded bits {f(0), . . . , f(M−1)} to wireless device 110. Although network node 120 is described as the transmitter and wireless device 110 as the receiver in the above examples, in other examples (e.g., uplink) wireless device 110 may perform the role of the wireless transmitter and network node 120 may be the wireless receiver.

Modifications, additions, or omissions may be made to method 400. Additionally, one or more steps in method 400 of FIG. 4 may be performed in parallel or in any suitable order. The steps of method 400 may be repeated over time as necessary.

Figure 5:
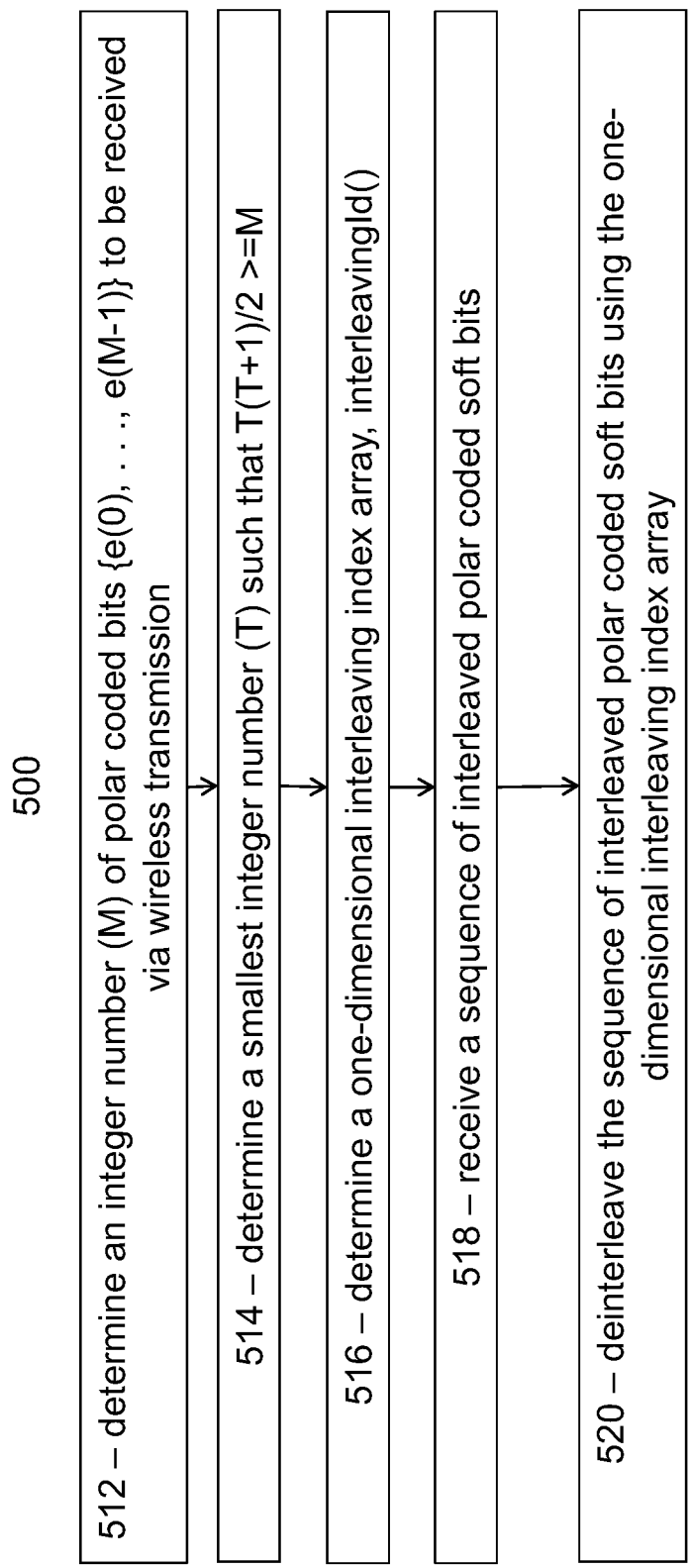
FIG. 5 is a flow diagram illustrating an example method in a network node, according to some embodiments.

FIG. 5 is a flow diagram illustrating an example method in a wireless receiver of deinterleaving coded soft bits, according to some embodiments. In particular embodiments, one or more steps of FIG. 5 may be performed by wireless device 110 or network node 120 described with respect to FIG. 3.

The method begins at step 512, where the wireless receiver determines an integer number (M) of polar coded bits {e(0), . . . , e(M−1)} for wireless transmission. For example, wireless device 110 may receive a scheduling request indicating that a wireless transmitters, such as network node 120, may transmit a particular amount of data to wireless device 110. Based on the amount of data to transmit, wireless device 110 may determine how many polar coded soft bits will be received.

At step 514, the wireless receiver determines a smallest integer number (T) such that T(T+1)/2>=M. For example, when M is determined to be 15, then T is 5. Other examples are described above.

At step 516, the wireless receiver determines a one-dimensional interleaving index array, interleavingId( ). The one-dimensional interleaving index array represents the column by column non-zero elements of a two-dimensional matrix. The two-dimensional matrix comprises a hypothetical T by T matrix containing the polar coded bits {e(0), . . . , e(M−1)} input row by row without using the lower right corner elements of the T×T matrix.

In particular embodiments, the wireless receiver determines the one-dimensional interleaving index array using a row counter array, an accumulated row counter array, and a column counter array, as described above. For example, the row counter array represents the total number of non-zero elements in a corresponding row of the two-dimensional matrix. Each element j in the accumulated row counter array represents the sum of each element in the row counter array from the first element up to the jth element. The column counter array is determined based on the row counter array and the accumulated row counter array. Using the row counter array, the column counter array, and the accumulated row counter array, particular embodiments may efficiently calculate the interleaving index array. Example pseudocode for calculating the interleaving index array using a row counter array, an accumulated row counter array, and a column counter array is described above. Although particular pseudocode examples are given above, one of skill will recognize other variations may accomplish the same or similar results.

In particular embodiments, the wireless receiver may determine the one-dimensional interleaving index array prior to polar decoding. For example, wireless device 110 may receive a scheduling request from which wireless device 110 can determine how many polar coded bits will eventually be received and determine the one-dimensional interleaving index array based on the number of polar coded bits before receiving the data. A particular advantage is that the one-dimensional interleaving index array may be determined outside of the critical reception chain, which reduces latency.

At step 518, the wireless receiver receives a sequence of interleaved polar coded soft bits {f(0), . . . , f(M−1)} from a wireless transmitter. For example, wireless device 110 may receive the sequence of interleaved polar coded soft bits {f(0), . . . , f(M−1)} from network node 120.

At step 520, the wireless receiver deinterleaves the sequence of interleaved polar coded soft bits {f(0), . . . , f(M−1)})} using the one-dimensional interleaving index array resulting in the output sequence {e(0), . . . , e(M−1)} wherein e(interleavingId(i))=f(i). For example, wireless device 110 may deinterleave the polar coded soft bits. The deinterleaving is efficient because, instead of calculating the two-dimensional T×T matrix, particular embodiments use the predetermined one-dimensional interleaving index array to deinterleave the bits.

Modifications, additions, or omissions may be made to method 500. Additionally, one or more steps in method 500 of FIG. 5 may be performed in parallel or in any suitable order. The steps of method 500 may be repeated over time as necessary.

Figure 6B:
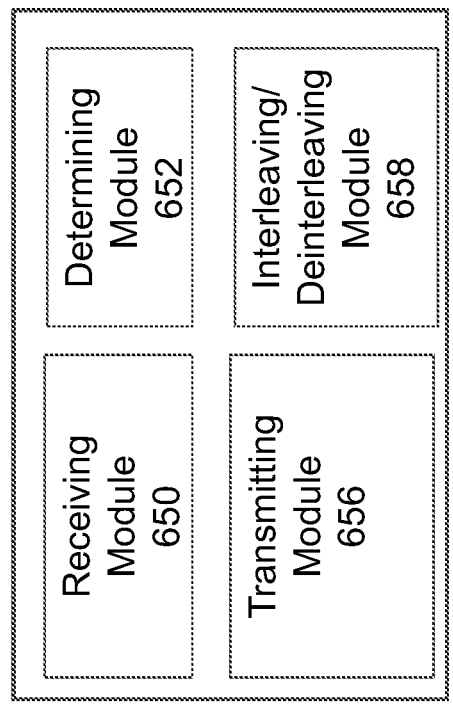
FIG. 6B is a block diagram illustrating example components of a wireless device.
Figure 6A:
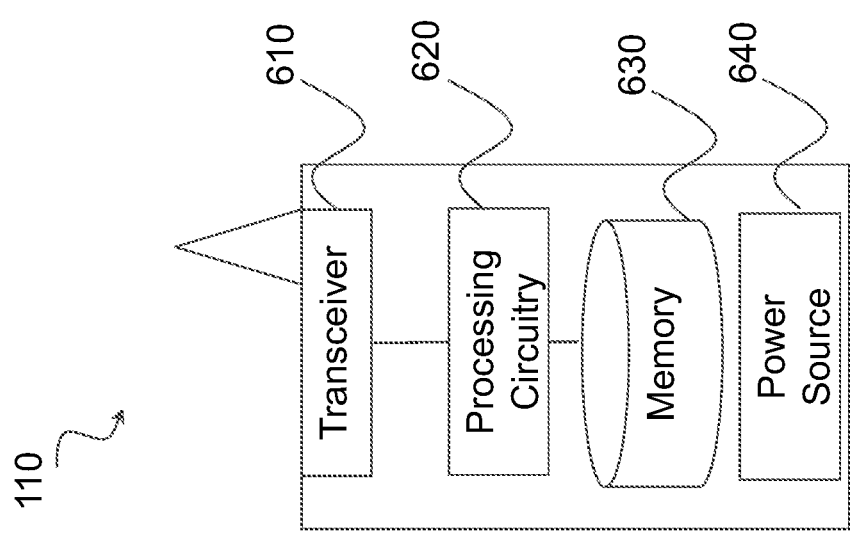
FIG. 6A is a block diagram illustrating an example embodiment of a wireless device.

FIG. 6A is a block diagram illustrating an example embodiment of a wireless device. The wireless device is an example of the wireless devices 110 illustrated in FIG. 3. In particular embodiments, the wireless device is capable of efficiently interleaving and deinterleaving polar coded bits. The wireless device may use an interleaving index array determined outside of the critical transmit/receive path to perform interleaving/deinterleaving.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 610, processing circuitry 620, memory 630, and power source 640. In some embodiments, transceiver 610 facilitates transmitting wireless signals to and receiving wireless signals from wireless network node 120 (e.g., via an antenna), processing circuitry 620 executes instructions to provide some or all of the functionality described herein as provided by the wireless device, and memory 630 stores the instructions executed by processing circuitry 620. Power source 640 supplies electrical power to one or more of the components of wireless device 110, such as transceiver 610, processing circuitry 620, and/or memory 630.

Processing circuitry 620 includes any suitable combination of hardware and software implemented in one or more integrated circuits or modules to execute instructions and manipulate data to perform some or all of the described functions of the wireless device. In some embodiments, processing circuitry 620 may include, for example, one or more computers, one more programmable logic devices, one or more central processing units (CPUs), one or more microprocessors, one or more applications, and/or other logic, and/or any suitable combination of the preceding. Processing circuitry 620 may include analog and/or digital circuitry configured to perform some or all of the described functions of wireless device 110. For example, processing circuitry 620 may include resistors, capacitors, inductors, transistors, diodes, and/or any other suitable circuit components.

Memory 630 is generally operable to store computer executable code and data. Examples of memory 630 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 640 is generally operable to supply electrical power to the components of wireless device 110. Power source 640 may include any suitable type of battery, such as lithium-ion, lithium-air, lithium polymer, nickel cadmium, nickel metal hydride, or any other suitable type of battery for supplying power to a wireless device.

Other embodiments of the wireless device may include additional components (beyond those shown in FIG. 6A) responsible for providing certain aspects of the wireless device's functionality, including any of the functionality described above and/or any additional functionality (including any functionality necessary to support the solution described above).

FIG. 6B is a block diagram illustrating example components of a wireless device 110. The components may include receiving module 650, determining module 652, transmitting module 656, and interleaving/deinterleaving module 658.

Receiving module 650 may perform the receiving functions of wireless device 110. For example, receiving module 650 may receive a sequence of interleaved polar coded soft bits according to any of the examples or embodiments described above (e.g., step 518 of FIG. 5). In certain embodiments, receiving module 650 may include or be included in processing circuitry 620. In particular embodiments, receiving module 650 may communicate with determining module 652, transmitting module 656, and interleaving/deinterleaving module 658.

Determining module 652 may perform the determining functions of wireless device 110. For example, determining module 652 may determine an integer number of polar coded bits (M), smallest integer (T,) such that $T(T+1)/2 >= M$, and a one-dimensional interleaving index array based on any of the embodiments or examples described above (e.g., steps 412-416 of FIG. 4 or steps 512-516 of FIG. 5). In certain embodiments, determining module 652 may include or be included in processing circuitry 620. In particular embodiments, determining module 652 may communicate with receiving module 650, transmitting module 656, and interleaving/deinterleaving module 658.

Transmitting module 656 may perform the transmitting functions of wireless device 110. For example, transmitting module 656 may transmit a sequence of interleaved polar coded bits according to any of the examples or embodiments described above (e.g., step 420 of FIG. 4). In certain embodiments, transmitting module 656 may include or be included in processing circuitry 620. In particular embodiments, transmitting module 656 may communicate with receiving module 650, determining module 652, and interleaving/deinterleaving module 658.

Interleaving/deinterleaving module 658 may perform the interleaving and deinterleaving functions of wireless device 110. For example, interleaving/deinterleave module 658 may interleave or deinterleave polar coded bits according to any of the examples or embodiments described above (e.g., step 418 of FIG. 4 or step 520 of FIG. 5). In certain embodiments, interleaving/deinterleaving module 658 may include or be included in processing circuitry 620. In particular embodiments, interleaving/deinterleaving module 658 may communicate with receiving module 650, determining module 652, and transmitting module 656.

Figure 7B:
FIG. 7B is a block diagram illustrating example components of a network node.
Figure 7A:
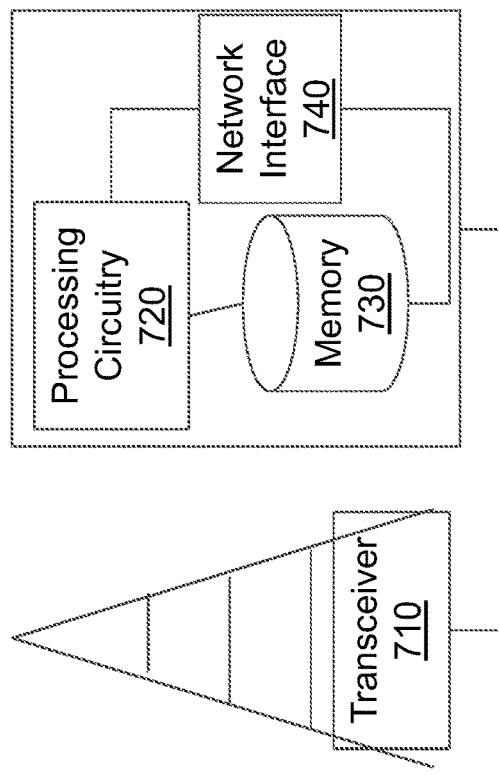
FIG. 7A is a block diagram illustrating an example embodiment of a network node.

FIG. 7A is a block diagram illustrating an example embodiment of a network node. The network node is an example of the network node 120 illustrated in FIG. 3. In particular embodiments, the network node is capable of efficiently interleaving and deinterleaving polar coded bits. The network node may use an interleaving index array determined outside of the critical transmit/receive path to perform interleaving/deinterleaving.

Network node 120 can be an eNodeB, a nodeB, gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 710, processing circuitry 720, at least one memory 730, and at least one network interface 740. Transceiver 710 facilitates transmitting wireless signals to and receiving wireless signals from a wireless device, such as wireless devices 110 (e.g., via an antenna); processing circuitry 720 executes instructions to provide some or all of the functionality described above as being provided by a network node 120; memory 730 stores the instructions executed by processing circuitry 720; and network interface 740 communicates signals to backend network components, such as a gateway, switch, router, Internet, Public Switched Telephone Network (PSTN), controller, and/or other network nodes 120. Processing circuitry 720 and memory 730 can be of the same types as described with respect to processing circuitry 620 and memory 630 of FIG. 6A above.

In some embodiments, network interface 740 is communicatively coupled to processing circuitry 720 and refers to any suitable device operable to receive input for network node 120, send output from network node 120, perform suitable processing of the input or output or both, communicate to other devices, or any combination of the preceding. Network interface 740 includes appropriate hardware (e.g., port, modem, network interface card, etc.) and software, including protocol conversion and data processing capabilities, to communicate through a network.

Other embodiments of network node 120 include additional components (beyond those shown in FIG. 7A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 7B is a block diagram illustrating example components of a network node 120. The components may include receiving module 750, determining module 752, transmitting module 756, and interleaving/deinterleaving module 758.

Receiving module 750 may perform the receiving functions of network node 120. For example, receiving module 750 may receive a sequence of interleaved polar coded soft bits according to any of the examples or embodiments described above (e.g., step 518 of FIG. 5). In certain embodiments, receiving module 750 may include or be included in processing circuitry 720. In particular embodiments, receiving module 750 may communicate with determining module 752, transmitting module 756, and interleaving/deinterleaving module 758.

Determining module 752 may perform the determining functions of network node 120. For example, determining module 752 may determine an integer number of polar coded bits (M), smallest integer (T,) such that T(T=1)/2>=M, and a one-dimensional interleaving index array based on any of the embodiments or examples described above (e.g., steps 412-416 of FIG. 4 or steps 512-516 of FIG. 5). In certain embodiments, determining module 752 may include or be included in processing circuitry 720. In particular embodiments, determining module 752 may communicate with receiving module 750, transmitting module 756, and interleaving/deinterleaving module 758.

Transmitting module 756 may perform the transmitting functions of network node 120. For example, transmitting module 756 may transmit a sequence of interleaved polar coded bits according to any of the examples or embodiments described above (e.g., step 420 of FIG. 4). In certain embodiments, transmitting module 756 may include or be included in processing circuitry 720. In particular embodiments, transmitting module 756 may communicate with receiving module 750, determining module 752, and interleaving/deinterleaving module 758.

Interleaving/deinterleaving module 758 may perform the interleaving and deinterleaving functions of network node 120. For example, interleaving/deinterleaving module 758 may interleave or deinterleave polar coded bits according to any of the examples or embodiments described above (e.g., step 418 of FIG. 4 or step 520 of FIG. 5). In certain embodiments, interleaving/deinterleaving module 758 may include or be included in processing circuitry 720. In particular embodiments, interleaving/deinterleaving module 758 may communicate with receiving module 750, determining module 752, and transmitting module 756.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
BTS Base Transceiver Station
CRC Cyclic Redundancy Check
CSI-RS Channel State Information Reference Signal
D2D Device to Device
DCI Downlink Control Information
DL Downlink
eNB eNodeB
FDD Frequency Division Duplex
IoT Internet-of-Things
LTE Long Term Evolution
M2M Machine to Machine
MCS Modulation and Coding Scheme
MIMO Multi-Input Multi-Output
ML Maximum Likelihood
MTC Machine Type Communication
NR New Radio
OFDM Orthogonal Frequency Division Multiplex
PBCH Physical Broadcast Channel
PC Parity Check
PDCCH Physical Downlink Control Channel
PUCCH Physical Uplink Control Channel
PUSCH Physical Uplink Shared Channel
QPSK Quadrature Phase Shift Keying
RAN Radio Access Network
RAT Radio Access Technology
RB Resource Block
RBS Radio Base Station RE Resource Element
RNC Radio Network Controller
RRC Radio Resource Control
RRH Remote Radio Head
RRU Remote Radio Unit
RSRP Reference Signal Received Power
RSRQ Reference Signal Received Quality
RS-SINR Reference Signal Signal-to-Interference-plus-Noise Ratio
SC Successive Cancellation
SC-FDMA Single Carrier-Frequency Division Multiple Access
SS System Synchronization
TDD Time Division Duplex
UAV Unmanned Aerial Vehicle
UCI Uplink Control Information
UE User Equipment
UL Uplink
URLLC Ultra-Reliable Low Latency Communication
UTRAN Universal Terrestrial Radio Access Network
WAN Wireless Access Network

The invention claimed is:

1. A method for use in a wireless transmitter of interleaving coded bits, the method comprising:
determining an integer number (M) of polar coded bits $\{e(0), \ldots, e(M-1)\}$ for wireless transmission;
determining a smallest integer number (T) such that $T(T+1)/2 \geq M$;
determining a one-dimensional interleaving index array, interleavingId( ), that represents the column by column non-zero elements of a two-dimensional matrix, wherein the two-dimensional matrix comprises a hypothetical T by T matrix containing the polar coded bits $\{e(0), \ldots, e(M-1)\}$ input row by row without using the lower right corner elements of the T×T matrix;
interleaving the polar coded bits $\{e(0), \ldots, e(M-1)\}$ using the one-dimensional interleaving index array resulting in the output sequence $\{f(0), \ldots, f(M-1)\}$ wherein $f(i)=e(\text{interleavingId}(i))$; and
transmitting the interleaved polar coded bits to a wireless receiver.

2. The method of claim 1, wherein determining M comprises receiving a scheduling request that includes an indication of an amount of data to be transmitted.

3. The method of claim 1, wherein the one-dimensional interleaving index array is determined prior to polar encoding.

4. The method of claim 1, wherein determining the one-dimensional interleaving index array comprises determining a row counter array, an accumulated row counter array, and a column counter array; and wherein each element in the row counter array represents the total number of non-zero elements in a corresponding row of the two-dimensional matrix.

5. The method of claim 4, wherein each element j in the accumulated row counter array represents the sum of each element in the row counter array from the first element up to the jth element; and wherein each element in the column counter array represents the total number of non-zero elements in a corresponding column of the two-dimensional matrix.

6. The method of claim 4, wherein the column counter array is determined based on the row counter array and the accumulated row counter array.

7. A wireless transmitter comprising processing circuitry, the processing circuitry operable to:
determine an integer number (M) of polar coded bits $\{e(0), \ldots, e(M-1)\}$ for wireless transmission;
determine a smallest integer number (T) such that $T(T+1)/2 \geq M$;
determine a one-dimensional interleaving index array, interleavingId( ), that represents the column by column non-zero elements of a two-dimensional matrix, wherein the two-dimensional matrix comprises a hypothetical T by T matrix containing the polar coded bits $\{e(0), \ldots, e(M-1)\}$ input row by row without using the lower right corner elements of the T×T matrix;
interleave the polar coded bits $\{e(0), \ldots, e(M-1)\}$ using the one-dimensional interleaving index array resulting in the output sequence $\{f(0), \ldots, f(M-1)\}$ wherein $f(i)=e(\text{interleavingId}(i))$; and
transmit the interleaved polar coded bits to a wireless receiver.

8. The wireless transmitter of claim 7, wherein the processing circuitry is operable to determine the one-dimensional interleaving index array by determining a row counter array, an accumulated row counter array, and a column counter array; and wherein each element in the row counter array represents the total number of non-zero elements in a corresponding row of the two-dimensional matrix.

9. The wireless transmitter of claim 8, wherein each element j in the accumulated row counter array represents the sum of each element in the row counter array from the first element up to the jth element; and wherein each element in the column counter array represents the total number of non-zero elements in a corresponding column of the two-dimensional matrix.

10. The wireless transmitter of claim 7, wherein the wireless transmitter comprises a network node.

11. The wireless transmitter of claim 7, wherein the wireless transmitter comprises a wireless device.

12. A method for use in a wireless receiver of deinterleaving coded bits, the method comprising:
determining an integer number (M) of polar coded bits $\{e(0), \ldots, e(M-1)\}$ to be received via wireless transmission;
determining a smallest integer number (T) such that $T(T+1)/2 \geq M$;
determining a one-dimensional interleaving index array, interleavingId( ), that represents the column by column non-zero elements of a two-dimensional matrix, wherein the two-dimensional matrix comprises a hypothetical T by T matrix containing the polar coded bits $\{e(0), \ldots, e(M-1)\}$ input row by row without using the lower right corner elements of the T×T matrix;
receiving a sequence of interleaved polar coded soft bits $\{f(0), \ldots, f(M-1)\}$ from a wireless transmitter; and
deinterleaving the sequence of interleaved polar coded soft bits $\{f(0), \ldots, f(M-1)\}$ using the one-dimensional interleaving index array resulting in the output sequence $\{e(0), \ldots, e(M-1)\}$ wherein $e(\text{interleavingId}(i))=f(i)$.

13. The method of claim 12, wherein determining M comprises receiving a scheduling request that includes an indication of an amount of data to be received.

14. The method of claim 12, wherein the one-dimensional interleaving index array is determined prior to receiving the sequence of interleaved polar coded soft bits.

15. The method of claim 12, wherein determining the one-dimensional interleaving index array comprises determining a row counter array, an accumulated row counter array, and a column counter array; and wherein each element in the row counter array represents the total number of non-zero elements in a corresponding row of the two-dimensional matrix.

16. The method of claim 15, wherein each element j in the accumulated row counter array represents the sum of each element in the row counter array from the first element up to the jth element; and wherein each element in the column counter array represents the total number of non-zero elements in a corresponding column of the two-dimensional matrix.

17. The method of claim 15, wherein the column counter array is determined based on the row counter array and the accumulated row counter array.

18. A wireless receiver comprising processing circuitry, the processing circuitry operable to:
   determine an integer number (M) of polar coded bits $\{e(0), \ldots, e(M-1)\}$ to be received via wireless transmission;
   determine a smallest integer number (T) such that $T(T+1)/2 \geq M$;
   determine a one-dimensional interleaving index array, interleavingId( ), that represents the column by column non-zero elements of a two-dimensional matrix, wherein the two-dimensional matrix comprises a hypothetical T by T matrix containing the polar coded bits $\{e(0), \ldots, e(M-1)\}$ input row by row without using the lower right corner elements of the T×T matrix;
   receive a sequence of interleaved polar coded soft bits $\{f(0), \ldots, f(M-1)\}$ from a wireless transmitter; and
   deinterleave the sequence of interleaved polar coded soft bits $\{f(0), \ldots, f(M-1)\}$ using the one-dimensional interleaving index array resulting in the output sequence $\{e(0), \ldots, e(M-1)\}$ wherein e(interleavingId(i))=f(i).

19. The wireless receiver of claim 18, wherein the wireless receiver comprises a network node.

20. The wireless receiver of claim 18, wherein the wireless receiver comprises a wireless device.

* * * * *